United States Patent
Kitada et al.

(10) Patent No.: US 6,895,548 B2
(45) Date of Patent: May 17, 2005

(54) SEMICONDUCTOR TESTING APPARATUS AND METHOD FOR OPTIMIZING A WAIT TIME UNTIL STABILIZATION OF SEMICONDUCTOR DEVICE OUTPUT SIGNAL

(75) Inventors: Masatsugu Kitada, Miyako-gun (JP); Motoyuki Katayama, Kitakyushu (JP); Akiyoshi Kuramoto, Miyako-gun (JP); Tatsuhisa Nii, Kitakyushu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 406 days.

(21) Appl. No.: 10/050,160

(22) Filed: Jan. 18, 2002

(65) Prior Publication Data

US 2002/0100000 A1 Jul. 25, 2002

(30) Foreign Application Priority Data

Jan. 19, 2001 (JP) .................................. 2001-012121
Aug. 23, 2001 (JP) .................................. 2001-253233
Aug. 23, 2001 (JP) .................................. 2001-253235

(51) Int. Cl.$^7$ ..................... H03M 13/00; G01R 31/28
(52) U.S. Cl. ............................. 714/815; 714/724
(58) Field of Search ........................ 714/815, 718, 714/719, 724, 731, 735, 744; 324/760, 765

(56) References Cited

U.S. PATENT DOCUMENTS 6,263,463 B1 * 7/2001 Hashimoto .................. 714/724

FOREIGN PATENT DOCUMENTS

JP           10-90347          4/1998

* cited by examiner

Primary Examiner—Guy J. Lamarre
Assistant Examiner—James C. Kerveros
(74) Attorney, Agent, or Firm—Finnegan, Henderson, Farabow, Garrett & Dunner, L.L.P.

(57) ABSTRACT

A semiconductor testing apparatus includes a test program memory for storing a test program, a measuring/deciding section for receiving the test program and supplying a test signal to the semiconductor device with a wait time set to a predetermined value and detecting an optimal value of a wait time, after an elapse of the wait time, based on a response signal outputted from the semiconductor device and effecting an OK/NG decision on the electrical characteristics of the semiconductor device based on a result of the measurement and, if the result of the decision is found to be "NG", remeasuring the electrical characteristics of the semiconductor device under a newly set wait time and effecting such remeasurement on the electrical characteristics of the semiconductor device at each newly set wait time until the result of such decision becomes "OK".

11 Claims, 5 Drawing Sheets

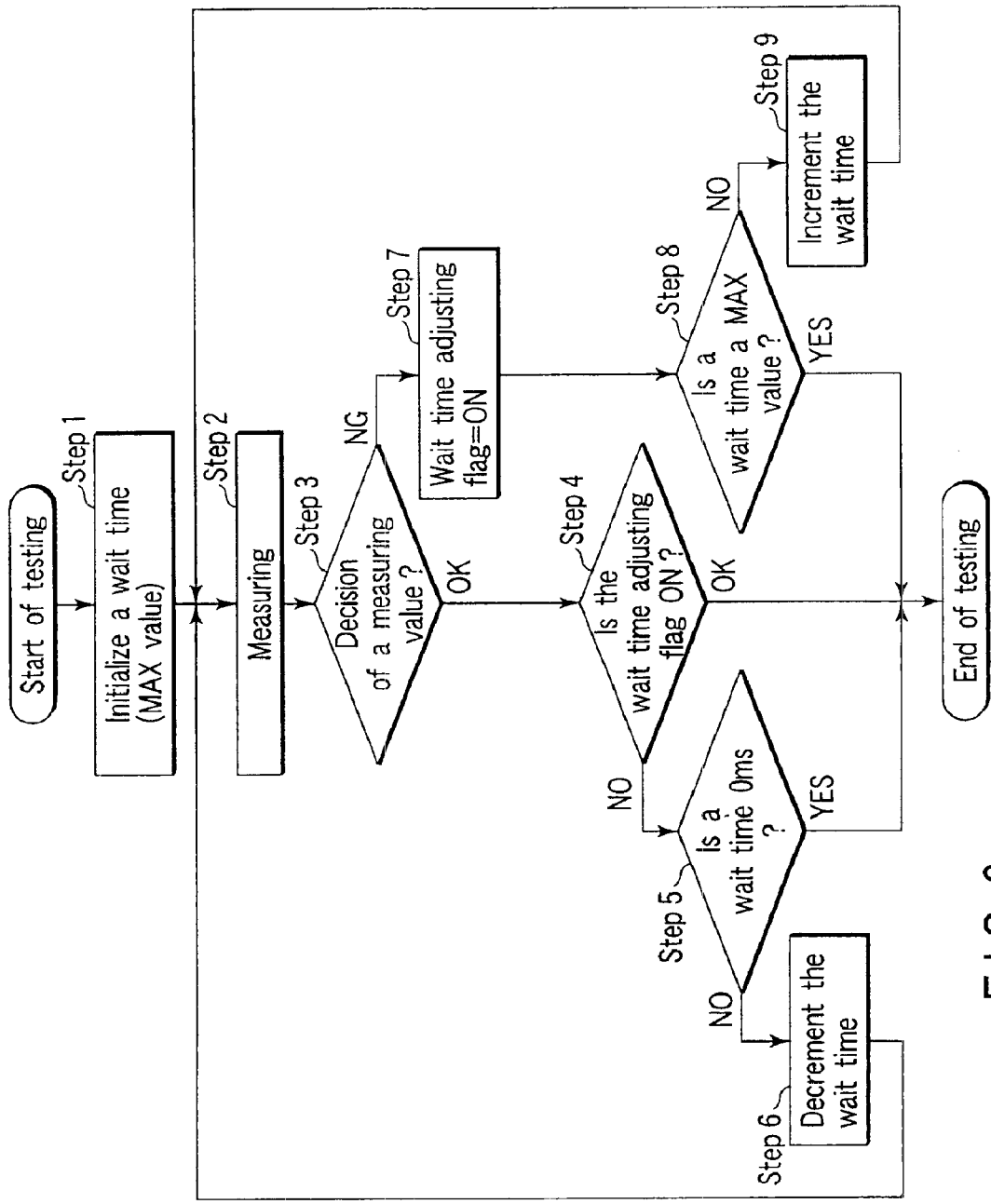
F I G. 3

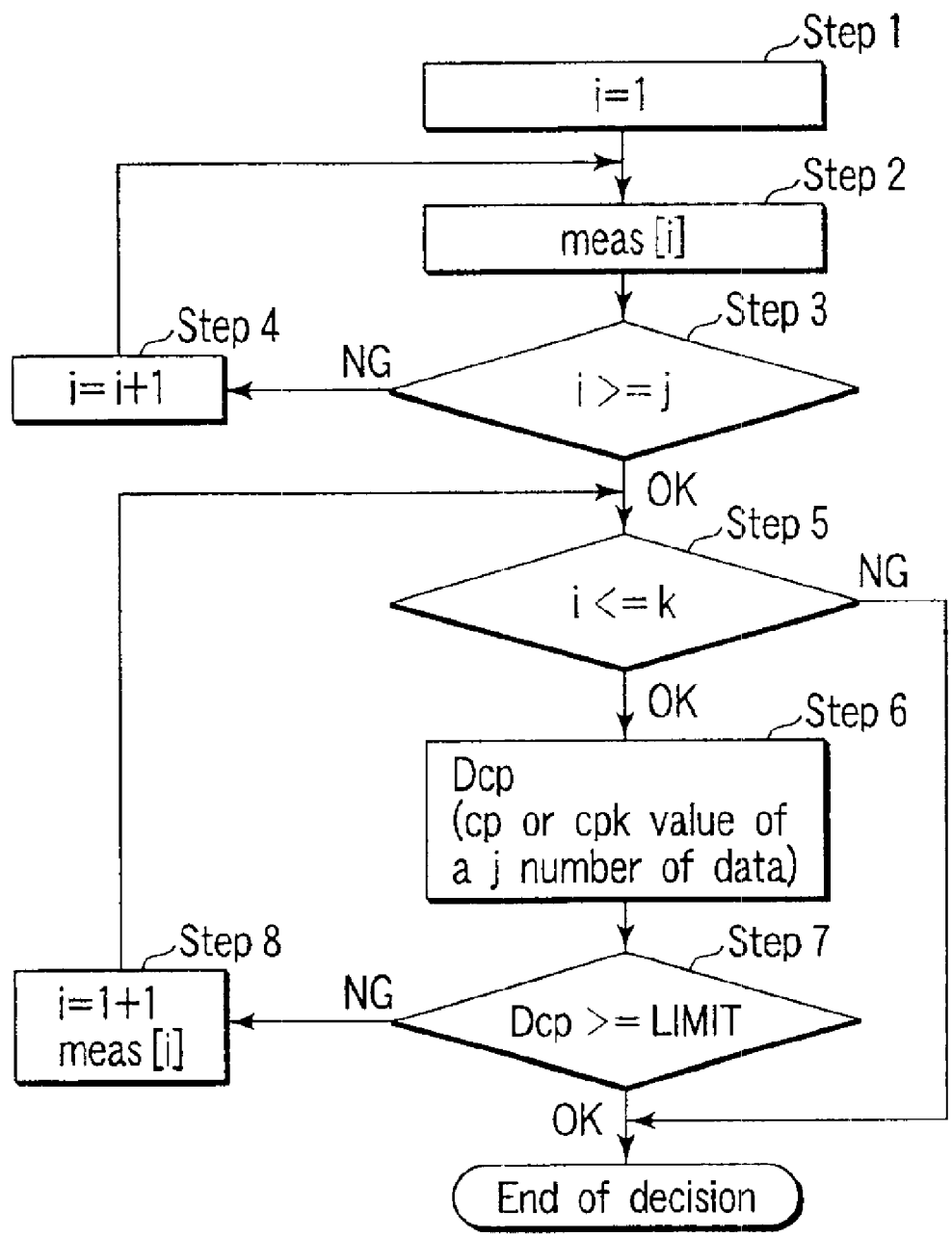
F I G. 6

SEMICONDUCTOR TESTING APPARATUS AND METHOD FOR OPTIMIZING A WAIT TIME UNTIL STABILIZATION OF SEMICONDUCTOR DEVICE OUTPUT SIGNAL

CROSS-REFERENCE TO RELATED APPLICATIONS

This application is based upon and claims the benefit of priority from the prior Japanese Patent Applications No. 2001-012121, filed Jan. 19, 2001; No. 2001-253233, filed Aug. 23, 2001; and No. 2001-253235, filed Aug. 23, 2001, the entire contents of all of which are incorporated herein by reference.

BACKGROUND OF THE INVENTION

1. Field of the Invention

The present invention relates to a semiconductor testing apparatus and semiconductor testing method for testing a semiconductor device for, for example, a television, a video tape recorder (VTR), a digital versatile disk (DVD) and audio application.

Further, the present invention relates to an apparatus and method for optimizing a wait time involved until an output signal of a semiconductor device becomes stable in the measurement of the electrical characteristics of the semiconductor device, such as the voltage, current, waveform, timing, phase, etc., of the output signal. In particular, the present invention is used for debugging a semiconductor device.

2. Description of the Related Art

Generally, resin-molded semiconductor device packages and wafer-state semiconductor devices before die-sorting are tested for their electrical characteristics and, based on the results, an OK/NG (OK/No Go) decision is made. When a semiconductor device is tested by the semiconductor testing apparatus for electrical characteristics, the testing apparatus optimizes a wait time involved until an output signal becomes stable. Here, a stable output signal means a state in which data values measured a plurality of times are similar to within a few percent. Therefore, an unstable output signal means a state in which data values measured a plurality of times are not similar to within a few percent. Further, a plurality of times means that the same measurement of for example, voltage is repeated, for example, 10 or 20 times.

Conventionally, optimization of the wait time is repeatedly made by human operation, by selecting the testing items for the optimization of the wait time and confirming data values following a change in the wait time.

In recent times, however, the number of items tested of the semiconductor device have enormously increased, thus much more time is needed in optimization operations on resultant wait times. These items include DC and AC measurement, function tests, etc. Various kinds of DC measurement are performed, and for each one the input signal value is varied, thus inevitably increasing the number of items involved.

As is set out above, the conventional method for optimizing the semiconductor testing time takes a lot of time.

BRIEF SUMMARY OF THE INVENTION

According to a first aspect of the present invention, a semiconductor testing apparatus comprises: a test program memory section for storing a test program including at least a wait time for testing a semiconductor device; a measuring/deciding section, connected to the test program memory section, for receiving the test program stored in the test program memory section and applying the test program to the semiconductor device, in accordance with the test program with the wait time set to a predetermined value, and for detecting the optimal value of the wait time through a series of processes comprising measuring, after elapse of the wait time, the electrical characteristics of the semiconductor device on the basis of the response signal outputted from the semiconductor device, and making an OK/NG decision on the electrical characteristics of the semiconductor device on the basis of the measurement results and, if the decision is "NG", remeasuring the electrical characteristics of the semiconductor device under a newly set wait time and, for each newly set wait time, performing the remeasuring operation on the electrical characteristics of the semiconductor device until the result of the decision is "OK" and initiating the next measuring when the result of the decision is "OK"; and a wait time initializing/changing control section, connected to the measuring/deciding section, for receiving the result of the decision by the measuring/deciding section after the initialization of the wait time included in the test program and controlling the measuring/deciding section to, if the result of the decision is "NG", repeat the setting of the wait time in a manner to sequentially increment the wait time toward an initially determined maximal value until the result of the decision is "OK" and, if the result of the decision is "OK", terminate the setting of the wait time.

According to a second aspect of the present invention, a method for testing a semiconductor device includes the steps of preparing a semiconductor device as a testing target; setting a wait time to an initialized value; supplying a test signal to the semiconductor device and, upon receipt of a response signal outputted from the semiconductor device in accordance with the test signal after an elapse of the initialized wait time, measuring the electrical characteristics of the semiconductor device; effecting an OK/NG decision on the semiconductor device in accordance with the result of measurement; if the result of the decision is found to be "NG", effecting a repeated setting of a wait time such that, until the result of the decision is "OK", the wait time is sequentially incremented from the initialized value toward an initially determined maximal value; and terminating the setting of the wait time if the result of the decision is "OK".

BRIEF DESCRIPTION OF THE SEVERAL VIEWS OF THE DRAWING

FIG. 3 is a flow chart showing a wait time optimizing method of a second aspect carried out by the use of the semiconductor testing apparatus of FIG. 1;

FIG. 6 is a flow chart showing a wait time optimizing method of a second aspect carried out by the use of the semiconductor testing apparatus of FIG. 4.

DETAILED DESCRIPTION OF THE INVENTION

The embodiments of the present invention will be described in more detail below by referring to the accompanying drawing.

Figure 1:
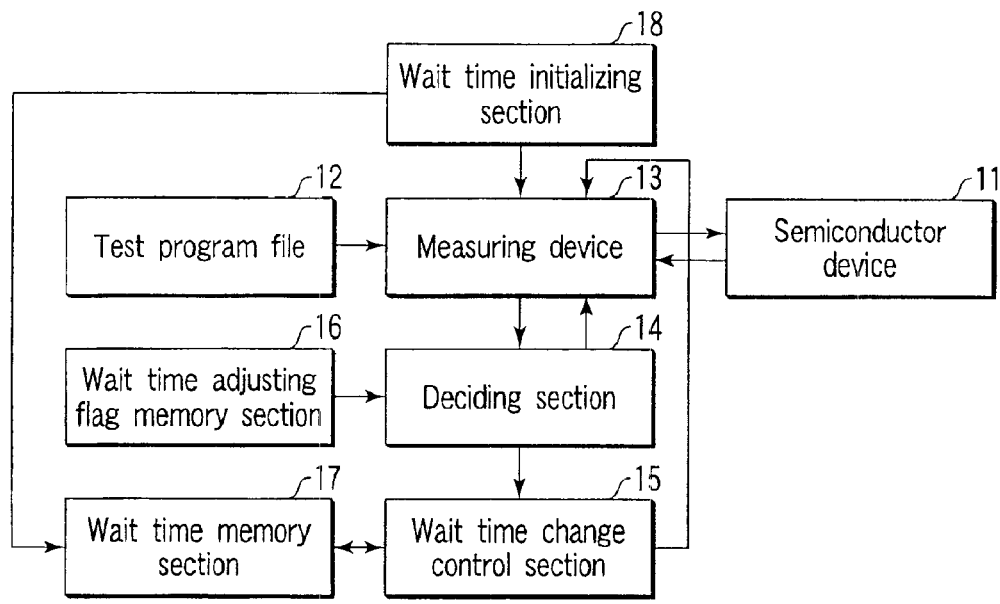
FIG. 1 is a block diagram showing an arrangement of a semiconductor testing apparatus according to a first embodiment of the present invention.

FIG. 1 shows an arrangement of a semiconductor testing device according to a first embodiment of the present invention.

In FIG. 1, a test program for testing a semiconductor device 11 as a testing target is stored in a test program file 12. The test program which is stored in the test program file 12 is supplied to a measuring device 13. Based on the test program a test input signal is supplied to the semiconductor device 11 by the measuring device 13. An output signal of the semiconductor device 11 is received by the measuring device 13. The characteristics of the semiconductor device 11 are measured by the measuring device 13 in accordance with this output signal. The measurement by the measuring device 13 is carried out each time a wait time previously stored in the test program file 12, that is, a wait time from the supply of the test input signal to the semiconductor device 11 until the output signal of the semiconductor device 11 becomes stable, is set to a predetermined value. The wait time, though differing dependent upon the kind of semiconductor device 11, is typically of the order of 1 to a few hundreds of ms.

A deciding section 14 decides the result of measurement by the measuring device 11 and controls the measuring device 11 such that, if the result of the decision is "OK", then measurement is shifted to the next test item. If the result of the decision is "NG", control is passed over to a wait time change control section 15. The optimal value of the wait time is detected by the wait time change control section 15. Upon a decision by the deciding section 14, a wait time adjusting flag is stored, as required, in a wait time adjusting flag memory section 16 and, in a subsequent decision, reference is made to the wait time adjusting flag.

The wait time change control section 17 effects control such that, until the result of the decision section 14 is "OK", a new wait time is set in accordance with a predetermined sequence. Upon control, as required, data on the wait time is referred to after being stored in the wait time memory section 17. With reference to the above-mentioned sequence, a semiconductor test time optimizing method will be set forth in more detail below in connection with the first and second embodiments.

The initial wait time value stored in the wait time memory section 17 is set by a wait time initializing section 18.

That is, the semiconductor testing apparatus of FIG. 1 has, as a basic structure, a measuring/deciding section including the measuring device 13 and deciding section 14 and a wait time initializing/changing control section including the wait time change control section 15 and wait time initializing section 18.

The measuring/deciding section measures the electrical characteristics of the semiconductor device 11 under a condition that the wait time stored in the test program file 12 is set to a predetermined value, and decides the result of such measurement that, if the result of the decision is found to be "NG", remeasuring is carried out under a newly set wait time and, until the result of the decision is "OK", such remeasuring is carried out each time the wait time is newly set. Through a series of such processes, the optimal wait time value is detected. The measuring/deciding section functions to shift the measurement to the next testing item if the result of decision is "OK".

The wait time initializing/changing control section has the following functions (a) or (b).

(a) First, all the wait times stored in the test program file 12 are initialized to 0 ms and, if, after this, the result of the decision by the measuring/deciding section is found to be "NG", the wait time is gradually incremented in a repeated setting toward an initially determined maximal value, until the result of decision is "OK", and the setting of the wait time is terminated if the result of the decision is "OK".

(b) First, all the wait times stored in the test program file 12 are initialized to an initially determined maximal value and, unless the result of the decision by the measuring/deciding section becomes "OK" and the wait time adjusting flag is set to an ON state, the wait time is gradually decremented toward 0 ms. If the result of the decision is found to be "NG", the wait time adjusting flag is set to an ON state and then the wait time is gradually incremented in a repeated setting toward the initially determined maximal value until the result of decision becomes "OK". If the result of the decision becomes "OK" and the wait time adjusting flag is set to an ON state, then the setting of the wait time is terminated. An incrementing or decrementing rate is, for example, about 10% of any determined wait time.

Figure 2:
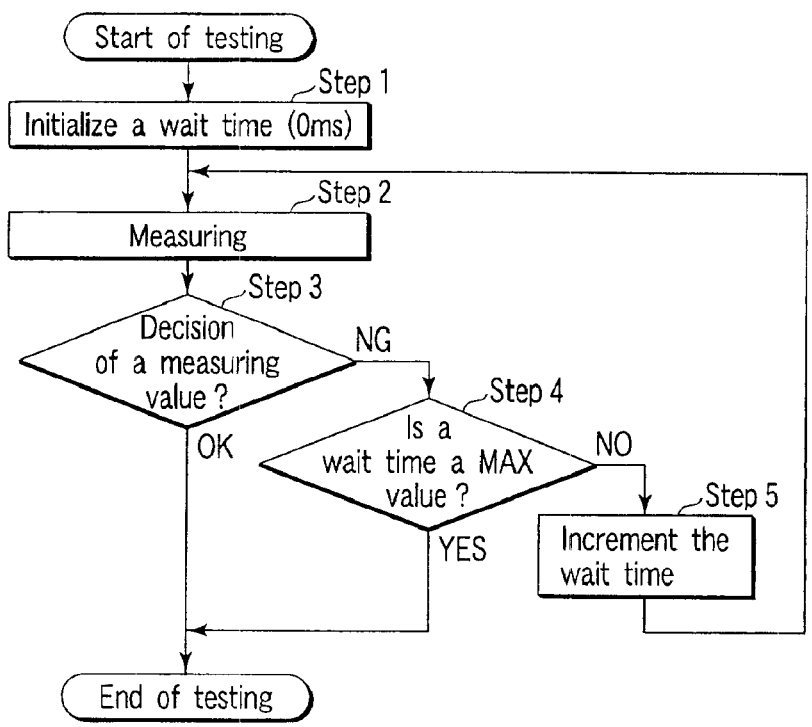
FIG. 2 is a flow chart showing a wait time optimizing method of a first aspect carried out by the use of the semiconductor testing apparatus of FIG. 1.

FIG. 2 shows a flow chart of a wait time optimizing method of a first aspect using the semiconductor testing apparatus of FIG. 1.

This optimizing method is adapted to detect an optimal wait time by first initializing the wait time to 0 ms and gradually incrementing the wait time, and this is performed in the steps explained below.

At Step 1, all the wait times stored in the test program file 12 are initialized to 0 ms.

At Step 2, the characteristics of the semiconductor device 11 are measured and, at Step 3, the result of the measurement is based on the decided value. If the result of the decision is "NG", then it is decided whether or not the wait time reaches an initially determined maximum value MAX (Step 4). If the maximum value MAX is not reached, then the wait time is incremented by, for example, about 10% of any determined wait time (Step 5) and control is returned again back to Step 2 and the characteristics of the semiconductor device 11 are measured. If the result of the decision becomes "OK" at Step 3, then a shifting is made to the next measurement.

The decision value used at Step 3 is an average value $\pm a\delta$ (a is arbitrarily designated) of a plurality of measured values obtained under a wait time of an initial value before adjustment. The decision value is calculated after the start of testing. It may be possible to initially obtain an average value $\pm a\delta$ before adjustment. In this case, the decision value is calculated from a measuring value file before the start of testing.

In the first embodiment using the semiconductor test time optimizing method, a series of measuring, deciding and wait time incrementing processes is performed until all the measurements are completed.

FIG. 3 shows a flow chart of a wait time optimizing method using a semiconductor testing apparatus according to a second aspect of the present invention.

This optimizing method sets a wait time to an optimal value by first initializing a wait time to a maximal value MAX and then gradually decrementing the wait time. This is performed at steps as set out below.

As Step 1, all the wait times stored in the test program file 12 are initialized to an initially determined maximal value MAX.

At Step 2, the characteristics of the semiconductor device 11 are measured and, at Step 3, decision is made based on the result of the measurement. If the result of the decision is "OK", then it is decided whether or not a flag stored in the wait time adjusting flag memory section 16 is set to an ON state (Step 4). If the flag is not set to an ON state, then it is decided whether or not the next wait time is 0 ms (Step 5). If the wait time is not 0 ms, the wait time is decremented by, for example, about 10% of any determined wait time (Step 6) and control goes back to Step 2 again to measure the characteristics of the semiconductor device 11.

Where, at Step 4, the wait time adjusting flag is decided as being set to an ON state and, at Step 5, the wait time is decided as being 0 ms, a shifting is made to the next measurement.

If, at Step 3, the result of the decision is found to the "NG", then a flag stored in the wait time adjusting flag memory section 16 is set to an ON state at Step 7. Then at Step 8, it is decided whether or not the wait time reaches the initially determined maximal value MAX. If it reaches the maximum value MAX, a shifting is made to the next measurement. If, on the other hand, it does not reach the maximal value MAX, the wait time is incremented by about 10% of any determined wait time (Step 9) and control goes back to Step 2 again to measure the characteristics of the semiconductor device 11.

Even in this case, a decision value used at Step 3 is an average value ±aδ (a is arbitrarily designated) obtained from a plurality of measured values under a wait time of an initial value before adjustment. The decision value is calculated after the start of testing. It may be possible to initially obtain an average value ±aδ before adjustment. In this case, the decision value is calculated from the measuring value file before the start of testing.

In the second aspect of a semiconductor testing time optimizing method, a series of measuring, deciding and wait time incrementing or wait time decrementing processes is performed until all the measurements are completed.

According to the above-mentioned semiconductor testing apparatus and semiconductor test time optimizing method, the optimized value of the wait time is automatically detected, while measuring the electrical characteristics of the semiconductor device. By doing so, the wait time is optimized and it is, therefore, possible to reduce the time required for the optimization of the wait time when compared with the conventional optimization method.

Figure 4:
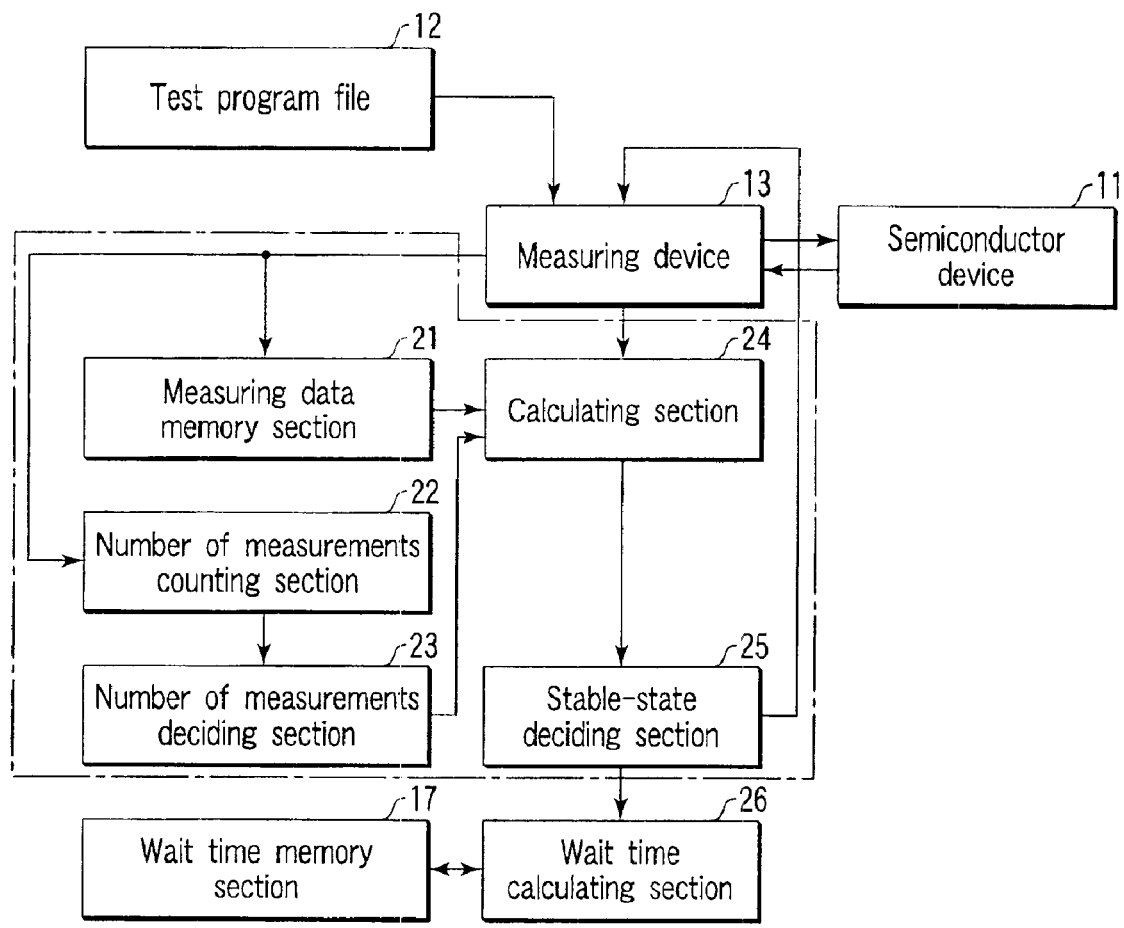
FIG. 4 is a block diagram showing an arrangement of a semiconductor testing apparatus according to a second embodiment of the present invention.

FIG. 4 shows an arrangement of a semiconductor device according to the second embodiment of the present invention. The same reference numerals are employed in this embodiment to designate parts or elements corresponding to those of the semiconductor testing apparatus according to the first embodiment shown in FIG. 1.

A measuring control apparatus 20 controls a measuring control device 13 and includes a measuring data memory section 21, a number of measurements counting section 22, a number of measurements deciding section 23, a calculating section 24 and a stable state deciding section 25.

A wait time calculating section 26 calculates a wait time based on an output from the measuring control apparatus 20. The wait time which is calculated by the wait time calculating section 26 is stored in a wait time memory section 17.

The measuring control apparatus 20 effects control such that the measuring device 13, measuring data memory section 21, number of measurements counting section 22, number of measurements deciding section 23, calculating section 24 and stable state deciding section 25 perform processing in accordance with a predetermined measuring processing loop. Further, the measuring control apparatus 20 allows them to exit from the measuring processing loop when the result of the decision by the stable state deciding section 25 is found to be "OK" and passes the control over to the wait time calculating section.

Figure 5:
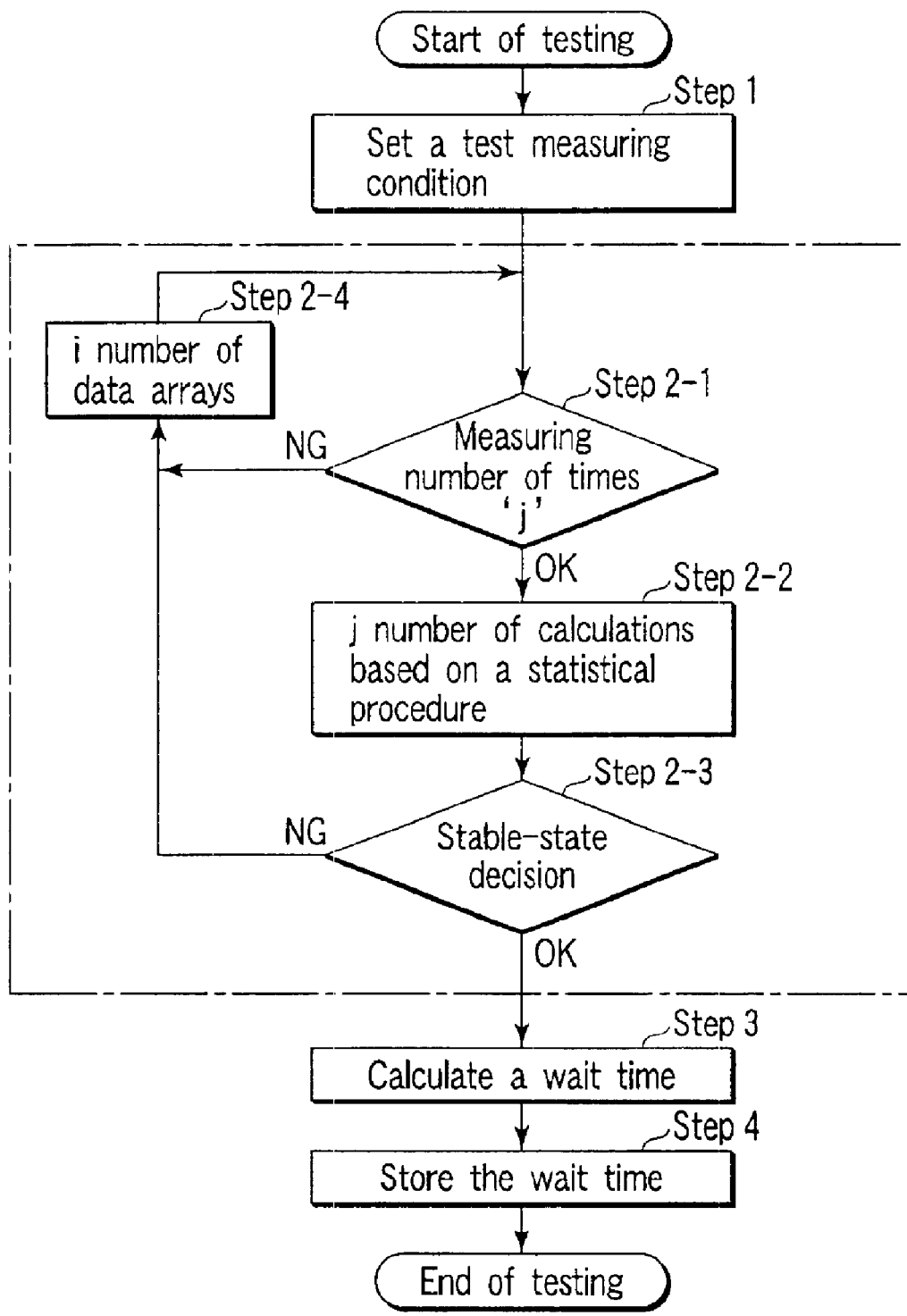
FIG. 5 is a flow chart showing a wait time optimizing method of a first aspect carried out by the use of the semiconductor testing apparatus of FIG. 4.

FIG. 5 is a flow chart showing one aspect of a wait time detection method using the semiconductor testing apparatus of FIG. 4.

In this wait time detecting method, if the test measuring condition is set by the measuring device 13 on the basis of a test program stored in the test program file 12 (Step 1), measuring is immediately started by the measuring device 13 and it is repeatedly performed. The results of the measurements are sequentially stored as a data array in the measuring data memory section 21 and the number of measurements counting section 22 counts the number of measurements, i, (i=a positive integer of 1 or more). When the number of measurements, i, reaches the calculation target number of measurements, j, (j=a positive integer of 1 or more), calculation is performed on a j number of data arrays thus far obtained by the j number of measurements, that is, performed on the data arrays by the calculating section 24 based on a statistical procedure, and analysis is made in realtime. The state of the measuring data is decided by the stable state deciding section 25 from the result of the analysis by the calculating section 24. If the result of the decision is found to be "NG", the number of measurements, i, are stepped up and control is passed once more to remeasurement. By doing so, further analysis is again made on a new data array in realtime based on the statistical procedure and the stable state of the measuring data is again decided. The remeasurement, reanalysis and redecision are repeated until the result of the decision becomes "OK" or i reaches a maximum number of measurements, k (>j), —Step 2.

When the result of the stable state decision becomes "OK" and control is passed, then the wait time calculating section 26 calculates a real measuring time corresponding to the number of measurements, i, and obtains an optimal value of the wait time (Step 3). Here, upon calculating the real measurement time corresponding to the number of measurements, i, it is possible to readily calculate it, for example, where a real measurement time for once is Δt, wait time is given by Δt×i. The calculated real measuring time is stored in the wait time memory section 17 (Step 4).

The above-mentioned Step 2 comprises a Step 2-1 for deciding whether or not the measuring number of steps, i, reaches a calculation target number of measurements, j, a Step 2-2 for effecting analysis by performing calculation on a j number of data arrays, a Step 2-3 for deciding the stable state of the measured data from a result of analysis and a Step 2-4 for stepping a measuring number of steps, i, to effect one remeasuring control.

FIG. 6 is a flow chart showing one practical example of a measuring processing loop by the measuring control apparatus 20 on the semiconductor testing apparatus of FIG. 4.

This measuring processing loop is carried out by the steps as set out below.

At Step 1, the number of measurements, i, is set to 1 and measuring means [i] is started and measuring data is stored (Step 2). At Step 3, it is decided whether or not i reaches the calculation target number of measurements, j. Where a result of the decision is found to be "NG" (i<j), i is stepped up by one (i is calculated) at Step 4. Thereafter, control again goes back to Step 2 and the measuring means [i] is repeatedly performed and the result of the measurement is stored as a data array in the measuring data memory section 21.

Where, at Step 3, the result of the decision on the number of measurements, i, is found to be "OK" (i≧j), it is decided whether or not the number of measurements, i, is less than a maximal number of measurements, k (>j),—Step 5. When the result of the decision is found to be "OK" (i<k), then on a j number of data arrays so far obtained by the number of measurements, j, analysis is made in realtime by the calculating section 24 based on the statistical procedure and calculation is made on a data value Dcp including a process capability cp or cpk of the j number of data—Step 6.

And it is decided whether or not the data value Dcp is less than a limit value LIMIT and the stable state of the measuring data is decided—Step 7. When the result of the decision is found to be "OK" (Dep≧—LIMIT), control exits from the measuring processing loop. When the result of the stable state decision is found to be "NG" (Dcp<LIMIT), i is stepped up by 1 and remeasuring means [i] control is carried out once—Step 8. After this, it is again decided whether or not i is less than the maximal number of measurements, k, —Step 5. When the result of the decision at Step 5 is found to be "NG" (i<j), then Dcp calculation and stable state decision are suspended and control exits from the measuring processing loop. That is, when the result of the stable state decision is found to be "NG" (Dcp<LIMIT), remeasuring is carried out and, on a new data array, reanalysis is made in realtime based on the statistical procedure, and redecision is made on the stable state of the measuring data. The remeasuring, reanalysis and redecision are repeatedly carried out until the result of the decision is "OK" or i exceeds the maximal number of measurements k (>j).

In the semiconductor testing apparatus shown in FIG. 4, the result of calculation by the wait time calculating section 26 is stored in the wait time memory section 17 and the function of performing automatic optimization control of the wait time of the test measuring condition based on the stored contents is imparted to the measuring control apparatus 20, so that the wait time can be automatically optimized.

The measuring control apparatus 20, number of measurements counting section 22, number of measurements deciding section 23, calculating section 24, stable state deciding section 25 and wait time calculating section 26 may each be constructed by dedicated hardware, or at least parts of these can be softwarized with the use of a CPU.

According to the semiconductor testing apparatus and semiconductor test time optimization method shown in FIGS. 4 to 6, it is possible to automatically detect the optimal value of the wait time while measuring the electrical characteristics of the semiconductor device. Since the wait time can be optimized based on the detection results, the time required for optimization of the wait time can be reduced, when compared with the conventional optimization method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor testing apparatus for supplying a test input signal to a semiconductor device as a testing target and receiving an output signal from the semiconductor device, comprising:

a test program memory section configured to store a test program including at least a wait time for testing the semiconductor device;

a measuring/deciding section, connected to the test program memory section,
for receiving the test program stored in the test program memory section,
for supplying the test signal to the semiconductor device in accordance with the test program having the wait time set to a predetermined value, and
for detecting an optimal value of the wait time through a series of processes comprising
measuring, after elapse of the wait time, the electrical characteristics of the semiconductor device on the basis of the response signal outputted from the semiconductor device;
making an OK/NG decision on the electrical characteristics of the semiconductor device on the basis of the measurement results;
if the decision is "NG", remeasuring the electrical characteristics of the semiconductor device under a newly set wait time;
for each newly set wait time, performing the remeasuring operation on the electrical characteristics of the semiconductor device until the result of a decision is "OK"; and
initiating the next measuring operation when the result of that decision is "OK"; and a wait time initializing/changing control section, connected to the measuring/deciding section;
for receiving the result of the OK/NG decision from the measuring/deciding section after an initialization of the wait time included in the test program; and
for controlling the measuring/deciding section to,
if the result of the OK/NG decision is "NG", repeat the setting of the wait time to sequentially increment the wait time toward an initially determined maxima/value until the result of the decision is "OK" and,
if the result of the decision is "OK", terminate the setting of the wait time.

2. The apparatus according to claim 1, further comprising:

a first memory section, connected to the measuring/deciding section, for storing the result of the OK/NG decision of the measuring/deciding section as a flag; and a second memory section, connected to the wait time initializing/changing control section, for storing the wait time set by the wait time initializing/changing control section.

3. A semiconductor testing apparatus for supplying a test input signal to a semiconductor device as a testing target and receiving an output signal from the semiconductor device, comprising:

a test program storing section configured to store a test program including at least a wait time for testing the semiconductor device;

a measuring/deciding section, connected to the test program storing section,
for receiving the test program stored in the test program storing section; and
for supplying the test signal to the semiconductor device in accordance with the test program having the wait time set to a predetermined value; and
detecting an optimal value of the wait time through a series of processes comprising:
measuring, after elapse of the wait time, the electrical characteristics of the semiconductor device on the basis of the response signal outputted from the semiconductor device;

making an OK/NG decision on the electrical characteristics of the semiconductor device on the basis of the measurement results, and if the decision is "NG", remeasuring the electrical characteristics of the semiconductor device under a newly set wait time and, for each newly set wait time, performing the remeasuring operation on the electrical characteristics of the semiconductor device until the result of such a decision is "OK", and initiating the next measurement operation when the result of that decision is "OK"; and a wait time adjusting flag memory section, connected to the measuring/deciding section, for setting a flag to an ON state when the result of the decision by the measuring/deciding section is "NG";

a wait time initializing/changing control section, connected to the measuring/deciding section and wait time adjusting flag memory section, for initializing the wait time included in the test program to an initially determined maximal value;

for thereafter, gradually decrementing the wait time to a predetermined value, unless the result of the decision by the measuring/deciding section is "OK" and the wait time adjusting flag is set to an ON state;

if the result of the decision is found to be "NG", for gradually incrementing the wait time toward an initially determined maximal value, until the result of the decision is "OK" after the wait time adjusting flag has been set to the ON state; and terminating the wait time setting if the result of the decision is found to be "OK" and the wait time adjusting flag is set in the ON state.

4. The apparatus according to claim 3, further comprising a memory device, provided in the wait time initializing/changing control section, for storing data on the wait time set by the wait time initializing/changing control section.

5. A semiconductor testing apparatus for supplying a test input signal to a semiconductor device as a testing target and receiving an output signal of the semiconductor device, comprising:

a measuring device for setting a test measuring condition including, an initial value of a wait time from a supply of the test input signal to the semiconductor device until the output signal of the semiconductor device becomes stable, and performing measurement on the semiconductor device under the set test measuring condition;

a measuring control apparatus, connected to the measuring device, for effecting control to allow the measuring device to perform processing in accordance with a predetermined measuring processing loop; and for deciding a stable state of the output signal of the semiconductor device, the measuring processing loop being a series of processes comprising performing measurements by the measuring device in a repeated way;

storing the results of the measurements, counting the number of measurements, i, where i=a positive integer of 1 or more, if it is decided that the number of measurements, i, equals a target number of measurements, j, where j=a positive integer of 1 or more;

analyzing in realtime based on a statistical procedure a data array corresponding to a j number of measurement results obtained by the number of measurements, j;

deciding a stable state of the measuring data from the result of analysis, if the result of the decision is found to be "NG", repeating measurement, realtime analysis on a new data array and stable state decision; and a wait time calculating device, connected to the measuring control apparatus, for, if the result of the decision by the measuring control apparatus is found to be "OK", allowing control to exit from the measuring processing loop and control to be passed; and the wait time calculating device counting a real measurement time corresponding to the number of measurements, i, and automatically detecting the optimal wait time value.

6. The apparatus according to claim 5, wherein said measuring control apparatus includes:

a measuring data storing device, connected to the measuring device, for storing data on the result of the measurement by the measuring device;

a number of measurements counting device, connected to the measuring device, for counting the number of measurements, i, measurements are repeatedly made by the measuring device;

a number of measurements deciding device, connected to the number of measurements counting device, for deciding whether the number of measurements, i, in the number of measurements counting device has reached a calculation target number of measurements, j;

a calculating device, connected to the measuring data memory device and number of measurements deciding device, for calculating based on a statistical procedure a data array corresponding to the j number of measurement results obtained from the number of measurements, j, and analyzing the measured data in realtime; and a stable state deciding device, connected to the calculation device, for deciding a stable state of the measured data from the analytical result of the calculation device, said measuring processing loop being a series of repeated processes for, if a result of stable state decision is found to be "NG", effecting the measurements, realtime analysis on a new d4a array based on the statistical procedure and stable state decision, until the result of decision becomes "OK" or exceeds a maximal number of measurements.

7. The apparatus according to claim 5, wherein the wait time calculating device calculates, where a real measuring time for once is $\Delta t$, real measuring times for i times as $\Delta t \times i$.

8. The apparatus according to claim 5 wherein the measuring control apparatus, store the result of calculation from the wait time calculating device in the wait time memory devices, and effects control to automatically optimize the wait time of the test measuring condition based on the stored value.

9. A method for testing a semiconductor device comprising the steps of:

preparing a semiconductor device as a testing target;

setting a wait time to an initialized value;

supplying a test signal to the semiconductor device and, upon receipt of a response signal outputted from the semiconductor device in accordance with the test signal after an elapse of the initialized wait time;

measuring the electrical characteristics of the semiconductor device;

effecting an OK/NG decision on the semiconductor device in accordance with the result of measurement, if the result of the decision is found to be "NG", effecting a repeated setting of the wait time that, until the result of the decision is "OK", the wait time is sequentially incremented from the initialized value toward an initially determined maximal value; and terminating the setting of the wait time if the result of the decision is "OK".

10. A method for testing a semiconductor device comprising the steps of:

preparing a semiconductor device as a testing target;

setting a wait time to an initialized value;

supplying a test signal to the semiconductor device, and upon receipt of a response signal which is outputted from the semiconductor device in accordance with the test signal after an elapse of the initialized wait time, measuring the electrical characteristics of the semiconductor device;

effecting an OK/NG decision on the semiconductor device in accordance with a result of the decision, if the result of the decision is found to be "NG", effecting repeated wait time setting as to allow the wait time to be sequentially decremented from the initialized value toward an initially determined minimal value until the result of the decision becomes "OK"; and terminating the wait time setting if the result of the decision becomes "OK".

11. A method for testing a semiconductor device comprising the steps of:

preparing a semiconductor device as a testing target;

setting test measuring conditions including an initialized value of a wait time from a supply of a test input signal to the semiconductor device until an output signal of the semiconductor device becomes stable;

performing repeated measurements on the semiconductor under the set different test measuring conditions;

storing the respective results of the measurements and counting the number of measurements, i, where i represents a positive integer of 1 or more;

deciding whether or not the number of measurements, i, has reached the calculation target number of measurements, j, where j represents a positive integer of 1 or more,
when it is decided that the number of measurements, i, has reached the calculation target number of measurements, j, analyzing in realtime based on a statistical procedure a data array corresponding to a j number of measurement results thus far obtained from the number of measurements, j; and deciding a state of the measured data from the result of analysis, and, if the result of decision is found to be "NG", effecting measurement, realtime analysis on the data array based on the statistical procedure and stable-state decision in a repeated setting until the result of decision becomes "OK" or exceeds a maximal number of measurements; and if the result of the decision is OK, calculating a real measuring time corresponding to the number of measurements, i, and detecting the optimal wait time value.

* * * * *

UNITED STATES PATENT AND TRADEMARK OFFICE
CERTIFICATE OF CORRECTION

PATENT NO. : 6,895,548 B2
DATED : May 17, 2005
INVENTOR(S) : Kitada et al.

It is certified that error appears in the above-identified patent and that said Letters Patent is hereby corrected as shown below:

Column 8,
Line 12, change "comprising" to -- comprising: --.
Line 37, change "maxima/" to -- maximal --.

Column 10,
Line 50, change "d4a" to -- data --.
Line 60, change "devices," to -- device, --.

Signed and Sealed this

Twenty-third Day of August, 2005

JON W. DUDAS
*Director of the United States Patent and Trademark Office*